United States Patent [19]
Yoshida

[11] Patent Number: 5,642,308
[45] Date of Patent: Jun. 24, 1997

[54] NONVOLATILE SEMICONDUCTOR MEMORY APPARATUS

[75] Inventor: Masanobu Yoshida, Yokohama, Japan

[73] Assignee: Fujitsu Limited, Japan

[21] Appl. No.: 451,905

[22] Filed: May 26, 1995

Related U.S. Application Data

[63] Continuation of Ser. No. 41,536, Apr. 1, 1993, abandoned, which is a continuation of Ser. No. 935,474, Aug. 26, 1992, abandoned, which is a continuation of Ser. No. 599,445, Oct. 18, 1990, abandoned.

[30] Foreign Application Priority Data

Oct. 20, 1989 [JP] Japan ................................. 2-273967
Oct. 20, 1989 [JP] Japan ................................. 1-273968

[51] Int. Cl.$^6$ .................................................. H01L 29/788
[52] U.S. Cl. ............... 365/185.12; 257/316; 365/185.12; 365/185.23; 365/208
[58] Field of Search ............................... 357/23.5, 31.6; 365/185, 205, 185.05, 185.12, 185.23, 208

[56] References Cited

U.S. PATENT DOCUMENTS

| | | | |
|---|---|---|---|
| 4,301,518 | 11/1981 | Kleas | 365/185 |
| 4,434,479 | 2/1984 | Chen et al. | 365/210 |
| 4,694,427 | 9/1987 | Miyamoto et al. | 365/185 |

FOREIGN PATENT DOCUMENTS

| | | |
|---|---|---|
| 57-180169 | 11/1982 | Japan. |
| 59-99760 | 6/1984 | Japan. |
| 64-61063 | 3/1989 | Japan. |
| 1-251499 | 10/1989 | Japan. |

OTHER PUBLICATIONS

Canepa et al., "Nonvolatile Memories", *IEEE International Solid State Circuits Conference*, vol. 31, Feb. 17–19, 1988, pp. 120–121, 323, New York, NY, USA.

*Primary Examiner*—Ngân V. Ngô
*Attorney, Agent, or Firm*—Staas & Halsey

[57] ABSTRACT

A nonvolatile semiconductor memory apparatus of a reference type is provided with a memory circuit, reference circuit and differential amplifier. A drain current of a reference cell transistor is formed such that it becomes almost half a drain current of a memory cell transistor, thereby enabling the memory circuit to be in symmetric relation with the reference circuit. Therefore, a parasitic capacitance in the memory circuit is made to be almost the same as that of the reference circuit, and thus a difference in noise level between a noise input to one input of the differential amplifier and a noise input to the other input of the differential amplifier is made to be almost zero, thereby speeding up the data read-out operation of the semiconductor memory apparatus.

4 Claims, 7 Drawing Sheets

NONVOLATILE SEMICONDUCTOR MEMORY APPARATUS

This application is a continuation of application No. 08/041,536, filed Apr. 1, 1993, now abandoned, which is a continuation of application Ser. No. 07/935,474, filed Aug. 26, 1992, now abandoned, which is a continuation of application Ser. No. 07/599,445, filed Oct. 18, 1990, now abandoned.

BACKGROUND OF THE INVENTION

1. Field of the Invention

This invention relates to a nonvolatile semiconductor memory apparatus, e.g., an EPROM, an EEPROM or a mask ROM, adopting a reference method pertaining to the data reading. That is, this invention relates to a nonvolatile semiconductor apparatus comprising a memory circuit part equipped with a memory cell transistor, a reference circuit part equipped with a reference cell transistor, and a differential amplifier for outputting the content of the memory cell transistor by comparing the output from the memory cell transistor with the output from the reference cell transistor.

Generally, the operation of a nonvolatile semiconductor device can be speeded up by adopting a reference method, and a further speed up is possible with a reduction in noise effect in a differential amplifier.

2. Related Art

A nonvolatile semiconductor memory apparatus adopting a reference method has been proposed, as detailed in FIG. 1.

This nonvolatile semiconductor memory apparatus is an EPROM. It comprises a memory circuit part 1, a reference circuit part 2 and a differential amplifier 3, and reads out data by comparing the output voltage $V_{MEM}$ of the memory circuit part 1 with the output voltage $V_{REF}$ of the reference circuit part 2.

The memory circuit part 1 comprises a power source line 11 supplied with a power source voltage $V_{CC}$, e.g. 5 V, an n channel MOS transistor (hereafter referred to as nMOS) 12 for a load, an nMOS 13 for bit line bias, a sense line SL, nMOS $14_0$ through $14_m$ for bit line selection, bit lines $BL_0$ through $BL_m$, word lines $WL_0$ through $WL_n$ and EPROM cells $15_{00}$ through $15_{nm}$ making up a memory cell transistor.

nMOS 12 is a depletion type nMOS whose drain is connected with the power source line 11. Its gate and source are commonly connected, and its common connection point (hereafter referred to as node $N_{MEM}$) is connected to one of the input terminals 31 of the differential amplifier 3 (turnover input terminal ⊖) and a drain of nMOS 13.

nMOS's 13 and $14_0$ through $14_m$ are enhancement type nMOS's. nMOS's $14_0$ through $14_m$, in particular, are the same size and have the same characteristics. Here, the source of nMOS 13 is connected to the drain of nMOS's $14_0$ through $14_m$ via the sense line SL. The respective sources of nMOS's $14_0$ through $14_m$ are connected to the drains of the first-line EPROM cells $15_{00}$ through the (n−1)th line $15_{n0}$, the drains of the second-line EPROM cells $15_{01}$ through the (n+1)th line $15_{n1}$, . . . , and the drains of the (m+1)th line EPROM cells $15_{0m}$ through the (n+1)th line $15_{nm}$ via bit lines $BL_0$ through $BL_m$.

The control gates of the first-line EPROM cells $15_{00}$ through the (m+1)th line $15_{0m}$, the second-line EPROM cells $15_{10}$ through the (m+1)th line $15_{1m}$, . . . , and the (n+1)th line EPROM cells $15_{n0}$ through the (m+1)th line $15_{nm}$ are connected to word lines $WL_0$ through $WL_n$, and the sources of all the EPROM cells $15_{00}$ through $15_{nm}$ are earthed.

EPROM cells $15_{00}$ through $15_{nm}$ are all the same size. Their plan view and cross section are as shown in FIGS. 2 and 3. Here, 16 is a p type silicon substrate, 17 is a field oxide film, $15_{00C}$ is a channel region, 18 and 19 are $SiO_2$ (silicon dioxide) films, $15_{00FG}$ is a floating gate, $15_{00CG}$ is a control gate in the word line $WL_0$, $15_{00}$ is a drain region, and $15_{00S}$ is a source region.

This EPROM cell $15_{00}$ has a channel width W of 1.5 μm (micro meters), a channel length L of 1.0 μm (1 micrometer= 10,000 angstroms), an overhang length A from the channel region $15_{00C}$ of the floating gate $15_{00FG}$ of 0.6 μm, an oxide film thickness $t_{CF}$ between the control gate $15_{00CG}$ and the floating gate $15_{00FG}$ of 0.03 μm (300 angstroms) and an oxide film thickness $t_{FS}$ between the floating gate $15_{00FG}$ and the channel region $15_{00C}$, also of 0.03 μm (300 angstroms).

Here, the capacitance $C_{CF}$ between the control gate $15_{00CG}$ and the floating gate $15_{00FG}$ is expressed as, $$C_{CF} = \epsilon SiO_2 \cdot \epsilon_0 \cdot \frac{L(A+W+A)}{t_{CF}} \quad (1)$$

and the capacitance $C_{FS}$ between the floating gate $15_{00FG}$ and the channel region $15_{00C}$ is expressed as, $$C_{FS} = \epsilon SiO_2 \cdot \epsilon_0 \cdot \frac{L \cdot W}{t_{FS}} \quad (2)$$

where $\epsilon SiO_2$ is the relative permittivity of $SiO_2$ films 18 and 19, and $\epsilon_0$ is the dielectric constant.

Also, the voltage $V_{FG}$ of the floating gate $15_{00FG}$ is expressed as, $$V_{FG} = \frac{C_{CF}}{C_{CF}+C_{FS}} \cdot V_{CG} + \frac{Q_{FG}}{C_{CF}+C_{FS}} \quad (3)$$

where $V_{CG}$ is the voltage of the control gate $15_{00FG}$ and $Q_{FG}$ is the charge of the floating gate $15_{00FG}$. Therefore, if there is no charge in the floating gate $15_{00FG}$, $$V_{FG} = \frac{C_{CF}}{C_{CF}+C_{FS}} \cdot V_{CG} \quad (4)$$

Substituting equations (1) and (2) into equation (4), $$V_{FG} = \frac{A+W+A}{A+W+A+W} \cdot V_{CG} \quad (5)$$

$$= \frac{2A+W}{2A+2W} \cdot V_{CG}$$

Substituting W=1.5 μm and A=0.6 μm into equation (5), $$V_{FG} = 0.64 \, V_{CG} \quad (6)$$

Therefore, when $V_{CG}$=5 V, $$V_{FG} = 3.2 \, V$$

In the memory circuit part 1 thus configured, the gate of nMOS 13 is supplied with $V_{BIAS}$, such as 2.5 V, and bit lines $BL_0$ through $BL_m$, i.e., the drains of EPROM cells $15_{00}$ through $15_{nm}$, are biased at about 1 V. This is purported to prevent a writing due to a so-called soft write phenomenon while data are read, if the drain voltages of EPROM cells $15_{00}$ through $15_{nm}$ are too high.

Word lines $WL_0$ through $WL_n$ are each supplied with word line selection signals $X_0$ through $X_n$ so that a row is selected, and the gates of n MOS $14_0$ through $14_m$ are each supplied with bit line selection signals $Y_0$ through $Y_m$ so that a column is selected. These word-line selection signals $X_0$ through $X_n$ and bit line selection signals $Y_0$ through $Y_m$ are all either 5 V (the power source voltage $V_{CC}$ at a selection time) or 0 V (the earth voltage $V_{SS}$ at a non-selection time).

If the EPROM cell selected from among $15_{00}$ through $15_{nm}$ memorizes the "ON" status, i.e., logical "1", a drain current flows through it. Conversely, if the selected EPROM cell memorizes the "OFF" status, i.e., logical "0", the drain current does not flow through it. Since nMOS's 12 and 13, as well as the nMOS selected from among $14_0$ through $14_m$ and the EPROM cell selected from among $15_{00}$ through $15_{nm}$, configure a current–voltage conversion circuit, the existence of a drain current appears as a change in voltage $V_{MEM}$ of the node $N_{MEM}$.

FIG. 4 shows the $I_{DS}$–$V_{FG}$ characteristic of of EPROM cells $15_{00}$ through $15_{nm}$ when the drain bias $V_{DS}$ is 1 V. When $V_{FG}$=3.2 V in the "ON" status in this EPROM, as described earlier, $I_{DS}$=60 [μA] (micro amperes).

The reference circuit part 2 comprises a power source line 21 supplied with a power voltage $V_{CC}$, nMOS's 22 and 23 for a load, nMOS 24 for bit line bias, a reference sense line RSL, nMOS's $25_0$ through $25_m$ for reference bit line selection (of which of nMOS's $25_0$ through $25_{m-1}$ are selected as dummy nMOS's), a reference bit line RBL, and EPROM cells $26_0$ through $26_n$ making up a reference cell transistor.

nMOS's 22 and 23 are depletion type nMOS's the same size and having the same characteristics as nMOS 12. nMOS's 22 and 23 are connected in parallel. That is, their respective drains are connected to the power source line 21. Their respective gates and sources are commonly connected, and their respective common connection points (hereafter referred to as a node $N_{REF}$) are connected to the other input terminal 32 (nonturnover input terminal ⊕) of the differential amplifier 3 and the drain of nMOS 24.

nMOS 24 is an enhancement type nMOS of the same size and having the same characteristics as nMOS 13. The source of nMOS 13 is connected to the drains of nMOS's $25_0$ through $25_m$ via the reference sense line RSL. nMOS's $25_0$ through $25_m$ are enhancement type nMOS's the same size and having the same characteristics as nMOS's $14_0$ through $14_m$.

The sources of nMOS $25_0$ through $25_{m-1}$, are earthed, and the gates thereof are supplied with 0 V so that they are always in the "OFF" status. The source of nMOS $25_m$, however, is connected to the drains of EPROM cells $26_0$ through $26_n$ via the reference bit line RBL, and the gates thereof are supplied with 5 V so that they are always in the "ON" status.

As for nMOS 13, the gate of nMOS 24 is supplied with $V_{BIAS}$, e.g., 2.5 V, and the reference bit line RBL, i.e., the drains of EPROM cells $26_0$ through $26_0$, is biased at about 1 V.

EPROM cells $26_0$ through $26_n$ are EPROM cells the same size and having the same characteristics as EPROM cells $15_{00}$ through $15_{nm}$. Their respective gates are connected to word lines $WL_0$ through $WL_n$ and their respective sources are earthed. Electrons are not injected into the respective floating gates of EPROM cells $26_0$ through $26_n$, which are configured to be in the "ON" status when the power source voltage $V_{CC}$ is supplied to the control gate and to have the same drain current as that which flows when any of EPROM cells $15_{00}$ through $15_{nm}$ of the memory circuit part 1 is turned to the "ON" status.

In the reference circuit part 2 thus configured, nMOS's 22, 23 and 24, plus any one of EPROM cells $26_0$ through $26_n$, configure a current–voltage conversion circuit. Since nMOS's 22 and 23 are parallel connected and their load resistance values are set at half that of the memory circuit part 1, the voltage $V_{REF}$ of the node $N_{REF}$ is set at the medium of the maximum and minimum values of the voltage $V_{MEM}$ of the node $N_{MEM}$. Such an EPROM uses this voltage $V_{REF}$ as a reference voltage.

Because the node $N_{MEM}$ of the differential amplifier 3 is connected with one of the input terminals 31 (turnover input terminal ⊖) and the node $N_{REF}$ thereof is connected with the other of the input terminals 32 (nonturnover input terminal ⊕), when $V_{MEM}$>$V_{REF}$ the differential amplifier 3 outputs a low level "L" (the earth voltage 0 V) to its output terminal 33, and when $V_{MEM}$<$V_{REF}$ the differential amplifier 3 outputs a high level "H" (the power source voltage $V_{CC}$). In this case, a voltage difference between $V_{MEM}$ and $V_{REF}$ of 50 mV suffices, and there is no need to change the output voltage from the memory circuit part 1 to either the high level "H" (power source voltage $V_{CC}$) or the low level "L" (the earth voltage 0 V). In other words, if the node $N_{MEM}$ has a voltage change as low as 100 mV, data can be read out.

Therefore, access time of the EPROM adopting the reference method can shorten the access time.

Incidentally, in an EPROM adopting such a reference method, even when the voltage difference between $V_{MEM}$ and $V_{REF}$ is smaller than 50 mV, as long as the differential amplifier 3 can detect the difference, its response can be further speeded up. However, in an EPROM of the prior art, shown in FIG. 1, when data are read, since the memory circuit part 1 and the reference circuit part 2 configure asymmetric circuits, a difference arises between the stray capacitance to the input terminal 31 of the differential amplifier 3 and that to the input terminal 32 thereof. Therefore, when a noise generated from an output circuit (not shown in the drawing) is inputted to input terminals 31 and 32 of the differential amplifier 3, a difference arises between the levels of the noises respectively inputted to the two input terminals 31 and 32. As a result, if a further speed up of an action of a nonvolatile semiconductor memory apparatus is aimed at with a difference between $V_{MEM}$ and $V_{REF}$ smaller than e.g. 50 mV, the apparatus tends to be affected by noise and to read data erroneously. The problem is that no speed-up can be achieved unless this point is solved.

To solve such a problem, this invention provides a nonvolatile semiconductor memory apparatus which adopts a reference method having a higher action speed with a smaller level difference between the noise inputted to each of the two input terminals of the differential amplifier by making the stray capacitance to the memory circuit part and that of the reference circuit part as near equal as possible.

SUMMARY OF THE INVENTION

The nonvolatile semiconductor memory device of this invention is a nonvolatile semiconductor memory device comprising a memory circuit part having at least a memory cell transistor, a reference circuit part having at least a reference cell transistor, and a differential amplifier. The differential amplifier outputs the memory content of the memory cell transistor by comparing its output with that of the reference cell transistor, where the drain current of the reference cell transistor approximates the median of the drain current of the memory cell transistor when the memory cell transistor is conducting and that when it is not.

A means for setting the drain current of the reference cell transistor at midpoint between the drain current at a conducting time and that at a nonconducting time as described earlier can be realized by heightening the threshold voltage of the reference cell transistor e.g. by injecting impurity boron ions into a channel region of the reference cell transistor, or by thickening the gate oxide film of the reference cell transistor. Alternatively, it can be realized by making the capacitive coupling ratio of the reference cell transistor $C_{CF}/(C_{CF}+C_{FS})$ smaller than that of the memory cell transistor, with the reference cell transistor comprising an authentic channel region and a dummy channel region. $C_{CF}$ is the capacitance between the control gate and the floating gate. $C_{FS}$ is the capacitance between the floating gate and the substrate.

Since the reference cell transistor in this invention is configured so that its drain current approximates a half of the drain current of the memory cell transistor when the memory cell transistor is conducting and that when it is not, by matching the load resistance value of the reference circuit part with that of the memory circuit part. Thus a reference voltage can be generated as where the load resistance of the reference circuit part is set equal to half the load resistance of the memory circuit part, as in the prior art (refer to FIG. 1), and the drain currents of the reference cell transistor and the memory cell transistor are the same. That is, it becomes possible to set load resistances (e.g. transistors for a load,) of the same number, of the same size and having the same characteristics in the reference circuit part as in the memory circuit part.

Hence, this invention enables the level difference between the noises inputted to both input terminals of a differential amplifier to be minimized by making the stray capacitance of the memory circuit part and the stray capacitance of the reference circuit part equal.

This invention is realized by heightening the threshold voltage of the reference cell transistor by injecting impurity ions into the channel region of the reference cell transistor or by thickening the gate oxide film of the reference cell transistor. Thus, there is no need to newly design the size of the reference cell transistor. Otherwise, the reference cell transistor is formed in the same process as the memory cell transistor.

PREFERRED EMBODIMENTS OF THIS INVENTION

The preferred embodiments of this invention are explained below by referring to FIGS. 5 through 9. Like the prior art shown in FIG. 1, the first preferred embodiment is an application of this invention to an EPROM. Numbers shown in FIGS. 5 through 9 which are the same as those shown in FIG. 1 indicate the same parts, and their explanations are omitted.

First Embodiment of this Invention

Figure 5:
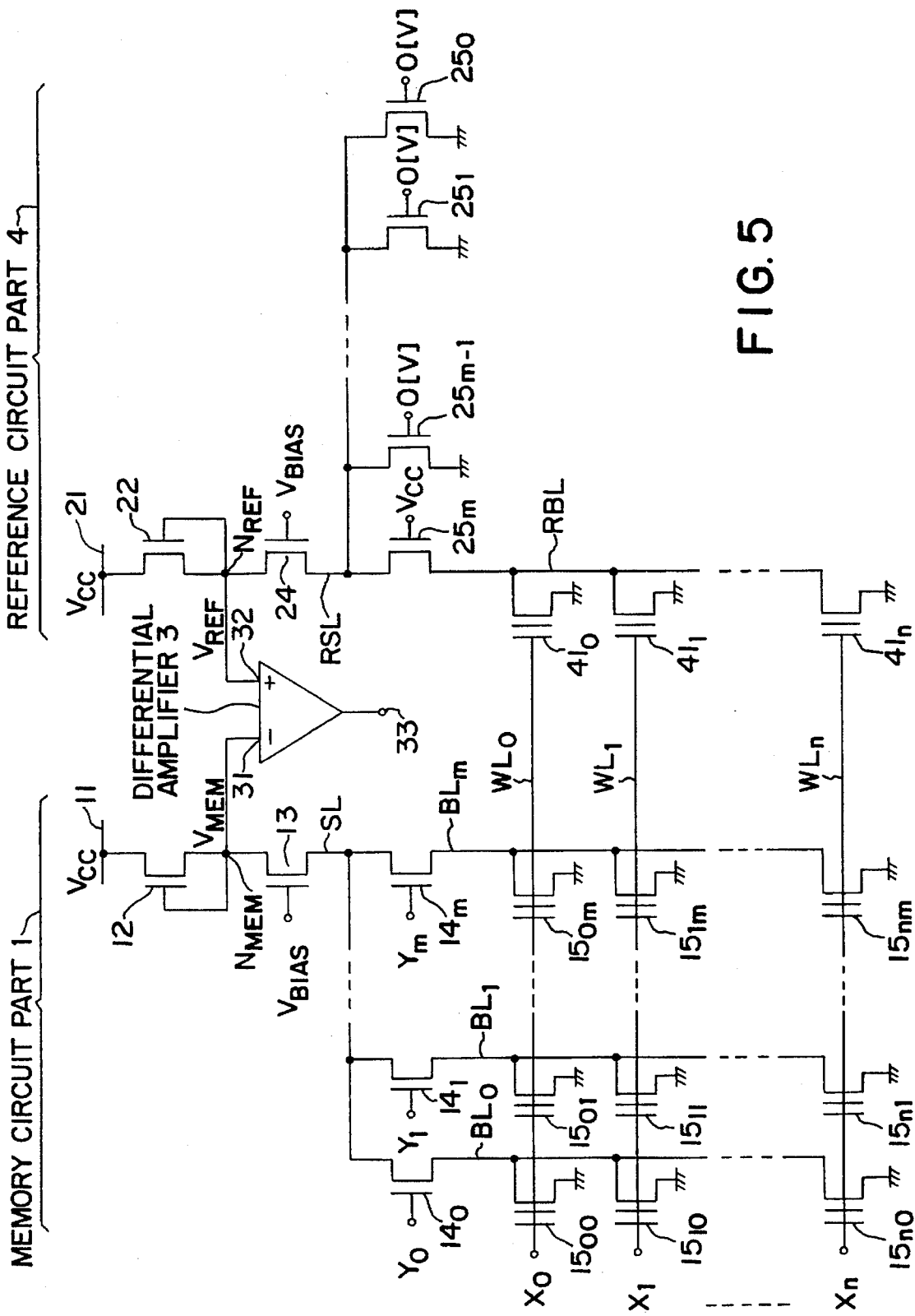
FIG. 5 is a circuit diagram that details the first embodiment when this invention is applied to an EPROM.

FIG. 5 is a circuit diagram that details the first embodiment which comprises a memory circuit part 1, a reference circuit part 4 and a differential amplifier 3. The part that is different from the EPROM shown in FIG. 1 as the prior art, is the reference circuit part 4.

The reference circuit part 4 comprises a power source line 21, an nMOS 22 for a load, an nMOS 24 for reference bit line bias, a reference sense line RSL, nMOS's $25_0$ through nMOS $25_m$ for reference bit line selection, a reference bit line RBL, and EPROM cells $41_0$ through $41_m$ configuring a reference cell transistor. The parts that are different from those of the prior art shown in FIG. 1 are the parts relating to nMOS 22 for a load and EPROM cells $41_0$ through $41_n$.

That is, in this first embodiment, only one nMOS 22, the same size and characteristics as nMOS 12 in the memory circuit part 1 is established as an nMOS for a load. The load resistance value of this nMOS 22 is set equal to that of the memory circuit part 1.

Figure 1:
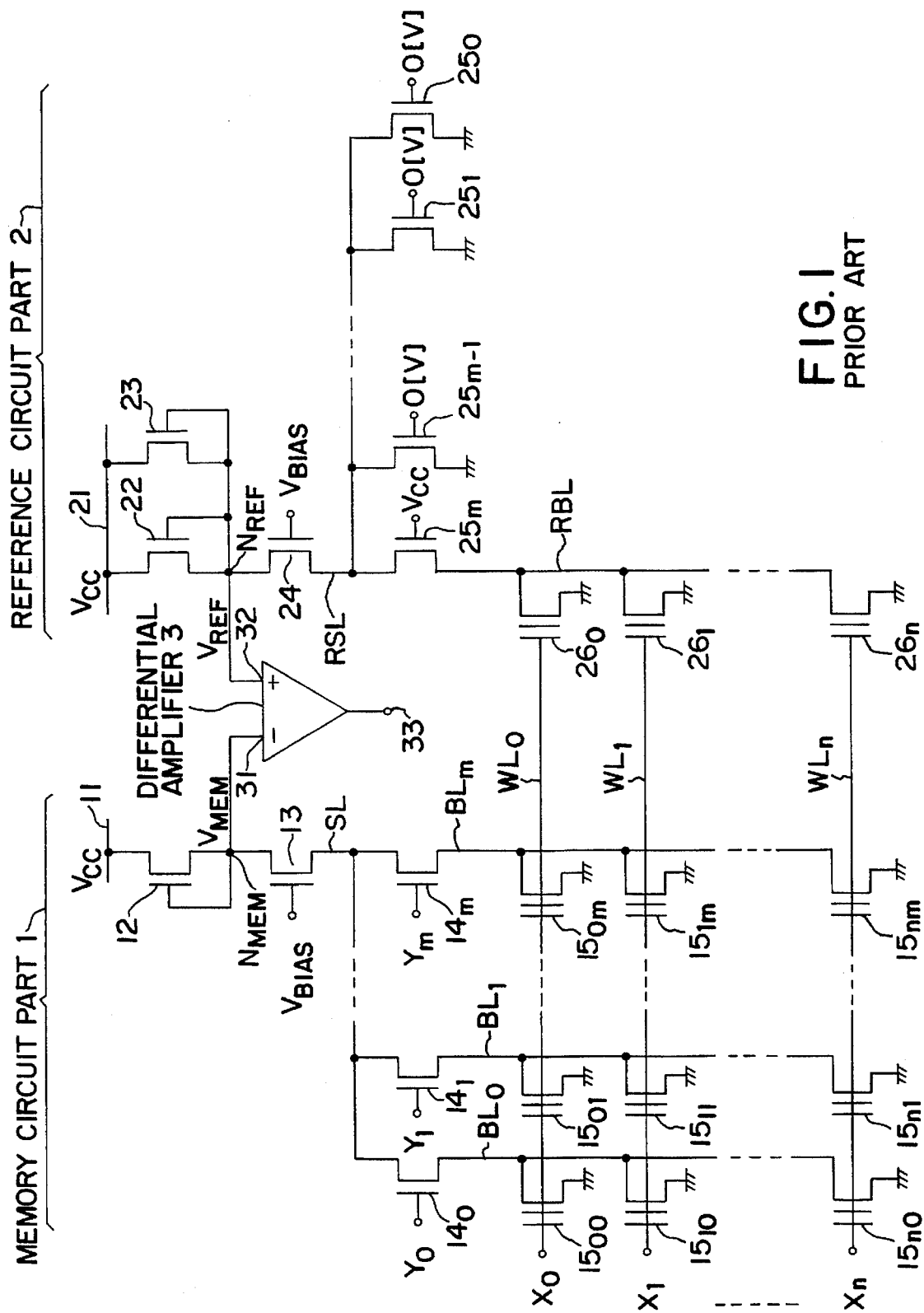
FIG. 1 is a circuit diagram that details an exemplary EPROM of the prior art.
Figure 2:
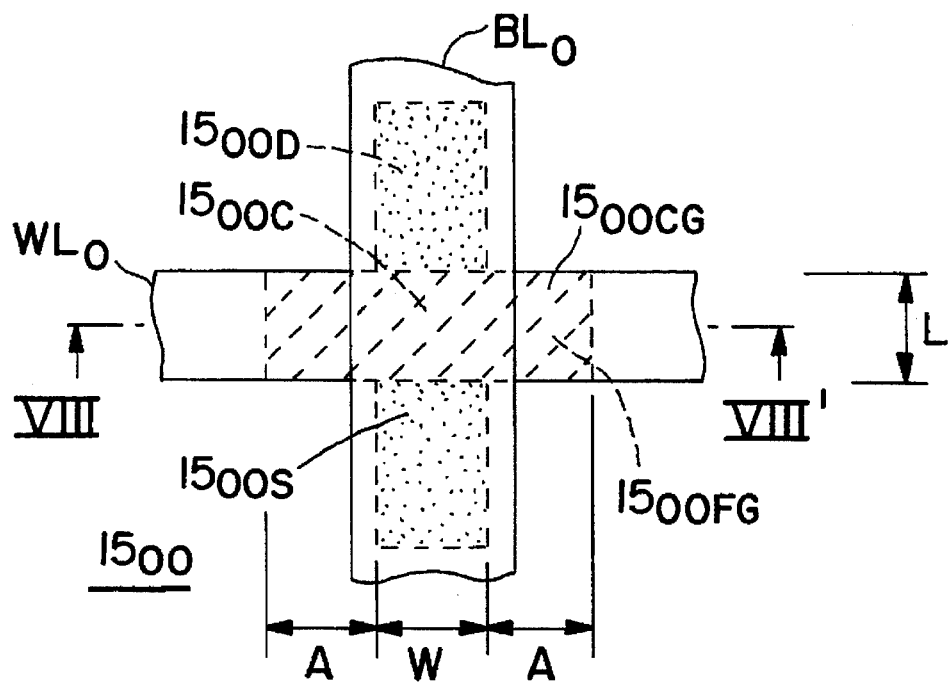
FIG. 2 is a plan view of the EPROM cell configuring a memory cell transistor.
Figure 3:
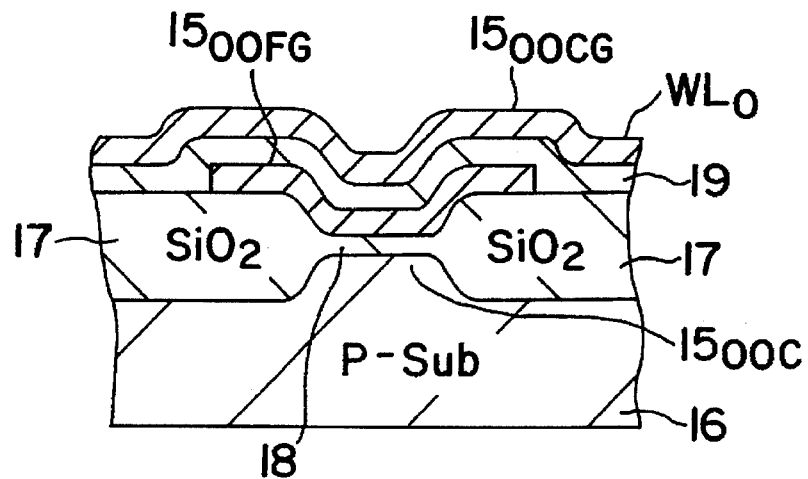
FIG. 3 is a cross section FIG. 2 across line VIII—VIII'.

Although EPROM cells $41_0$ through $41_n$ are formed the same size as EPROM cells $15_{00}$ through $15_{nm}$ shown in FIG. 1 of the prior art, the threshold voltage $V_{th41}$ of EPROM cells $41_0$ through $41_n$ is set higher than the threshold voltage $V_{th15}$ of EPROM cells $15_{00}$ through $15_{nm}$. Thus, their drain current approximates half that of EPROM cells $15_{00}$ through $15_{nm}$ in the "ON" status. At this time, the necessary threshold voltage $V_{th}$ differs, depending on the component characteristics. For example, if the threshold voltage $V_{th26}$ of EPROM cells $26_0$ through $26_n$ is 2 V, the threshold voltage $V_{th41}$ of EPROM cells $41_0$ through $41_n$ is higher, e.g., between 2.5 V and 3.5 V. One way to increase the threshold voltage $V_{th}$ is to inject boron ion into the channel region. When the threshold voltage is heightened by a boron ion injection, the size of EPROM cells $41_0$ through $41_n$ need not be newly redesigned. That is, as with the existing EPROM cells $26_0$ through $26_n$, they can be designed to be the same size as EPROM cells $15_{00}$ through $15_{nm}$. Also at this time, other than the process of ion injection to the channel region, the control gates, the floating gates, the drains and the sources of EPROM cells $41_0$ through $41_n$ can be respectively formed in the same process as that of EPROM cells $15_{00}$ through $15_{nm}$.

In this first embodiment, although the nMOS for a load in the reference circuit part 4 comprises only one nMOS, i.e., nMOS 22, whose load resistance value is set equal to that of the memory circuit part 1, since the drain current of EPROM cells $41_0$ through $41_n$ is set at approximately half of that of EPROM cells $15_{00}$ through $15_{nm}$. However, the voltage $V_{REF}$ of the node $N_{REF}$ is equal to that the prior art shown in FIG. 1. That is, the voltage $V_{REF}$ of the node $N_{REF}$ is set at the median of the maximum and minimum of voltage $V_{MEM}$ of the node $N_{MEM}$. Consequently, the memory data in EPROM cells $15_{00}$ through $15_{nm}$ can be read, as in the prior art shown in FIG. 1.

Also in this first embodiment, when nMOS $14_m$ is turned to the "ON" status and bit line $BL_m$ is selected, for example, since nMOS's $14_0$ through $14_{m-1}$ are in the "OFF" status, the memory circuit part 1 and the reference circuit part 4 become virtually entirely symmetric circuits. Accordingly, the stray capacitance of nMOS 12 for a load, the stray capacitance of nMOS 22 for a load, the stray capacitance of the sense line SL, the stray capacitance of the reference sense line RSL, the stray capacitance of n MOS $14_0$ through $14_m$ for the selection among bit lines $BL_0$ through $BL_m$, the stray capacitance of nMOS's $25_0$ through $25_m$ for selection of the reference bit line RBL, the stray capacitance of bit line $BL_m$, and the stray capacitance of the reference bit line RBL are all the same. That is, the stray capacitance of the memory circuit part 1 measured from one input terminal 31 of the differential amplifier 3 and that of the reference circuit part 4 measured from the other input terminal 32 of the difference amplifier 3 are approximately the same. This is similar to the case where any one of nMOS's $14_0$ through $14_{m-1}$ is selected to be turned to the "ON" status.

Hence, according to this first embodiment, the level difference between the noise inputted to one input terminal 31 (turnover input terminal $\ominus$) of the differential amplifier 3 and the noise inputted to the other input terminal 32 (nonturnover input terminal $\oplus$) thereof becomes small. These noises are offset by the differential amplifier and has very little effect on the data reading. That is, erroneous data reading is prevented.

As explained, since the noise effect is made in significant, even if the voltage change at node $N_{MEM}$ is made smaller than in the prior art, the data reading of EPROM cells $15_{00}$ through $15_{nm}$ is easily done. Therefore, this first embodiment has the effect of attaining a higher action speed than the prior art shown in FIG. 1.

Second Embodiment of this Invention

The circuit configuration of the second embodiment is the same as that shown in FIG. 5. However, the component structure of EPROM cells $41_0$ through $41_n$ is different.

Figure 6:
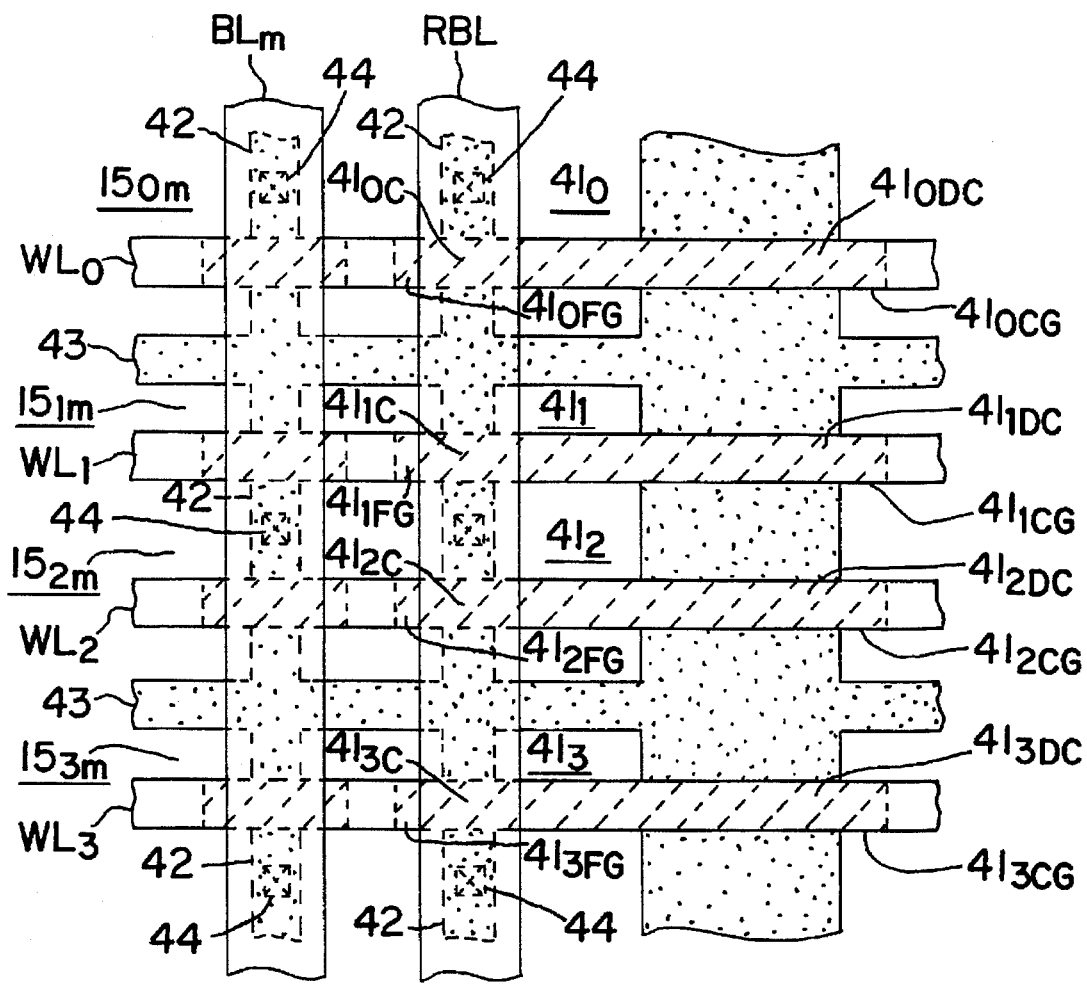
FIG. 6 is a plan view of a part of the memory circuit part and the reference part of the second embodiment of this invention.

A plan view of EPROM cells $41_0$ through $41_n$ is shown in FIG. 6. Here, $41_{0C}$ through $41_{3C}$, $41_{0DC}$ through $41_{3DC}$, $41_{0FG}$ through $41_{3FG}$, and $41_{0CG}$ through $41_{3CG}$ are the authentic channel regions, the dummy channel regions, the floating gates, and the control gates, respectively, of EPROM cells 410, 411, 412, and $41_3$. 42 is a drain region, 43 is a source region and 44 is a contact hole.

Figure 7:
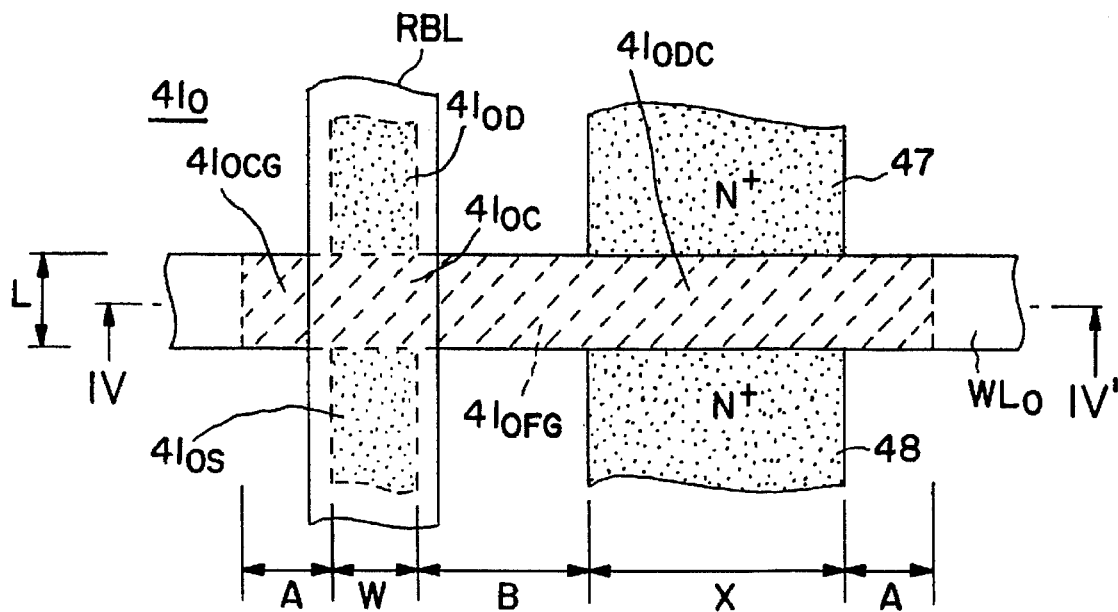
FIG. 7 is a plan view of the EPROM cell configuring the reference cell transistor of the second embodiment of this invention.
Figure 8:
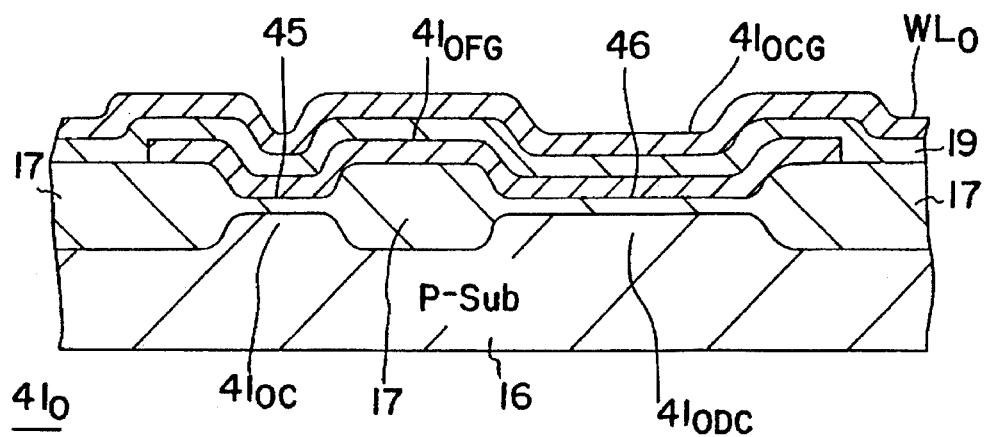
FIG. 8 is a cross section of FIG. 7 across line IV—IV'.

EPROM cells $41_0$ through $41_n$ are all made the same size. EPROM cell $41_0$ is explained in detail as being representative of EPROM cells $41_0$ through $41_n$. A plan view is shown in FIG. 7 and a cross section is shown in FIG. 8. 45 and 46 are $SiO_2$ films. $41_{0D}$ is a drain region. $41_{0S}$ is a source region. 47 and 48 are $N^+$ diffused layers.

The exemplary dimensions of this EPROM cell $41_0$ are as follows. The channel width W of the authentic channel region $41_{0C}$ is 1.5 µm. The channel length L of the authentic and dummy channel region $41_{0C}$ and $41_{0DC}$ is 1.0 µm. The channel width X of the dummy channel region $41_{0DC}$ is 40 µm. The overhang length A from the authentic and dummy channel regions $41_{0C}$ and $41_{0DC}$ is 0.6 µm. The space B between the authentic channel region $41_{0C}$ and the dummy channel region $41_{0DC}$ is 2.8 µm. The oxide film thickness $t_{CF}$ between the control gate $41_{0CG}$ and the floating gate $41_{0FG}$ and the oxide film thickness $t_{FS}$ between the floating gate $41_{0FG}$ and the channel regions $41_{0C}$ or $41_{0DC}$ are both 0.03 µm (300 angstroms).

In this a configuration, the capacitance $C_{CF}$ between the control gate and the floating gate of EPROM cells $41_0$ through $41_n$ is expressed as, $$C_{CF} = \epsilon\, SiO_2 \cdot \epsilon_0 \cdot \frac{L(A+W+B+X+A)}{t_{CF}} \quad (7)$$

and the capacitance $C_{FS}$ between the floating gate and the substrate is expressed as, $$C_{FS} = \epsilon\, SiO_2 \cdot \epsilon_0 \cdot \frac{L(W+X)}{t_{FS}} \quad (8)$$

When equations (7) and (8) are substituted into equation (4), $$V_{FG} = \frac{A+W+B+X+A}{A+W+B+X+A+W+X} \cdot V_{CG} \quad (9)$$

$$= \frac{2A+W+B+X}{2A+2W+B+2X} \cdot V_{CG}$$

Substituting W=1.5 µm, A=0.6 µm, B=2.8 µm, and X=40 µm into equation (9), $$V_{FG}=0.52\, V_{CG}$$

Figure 4:
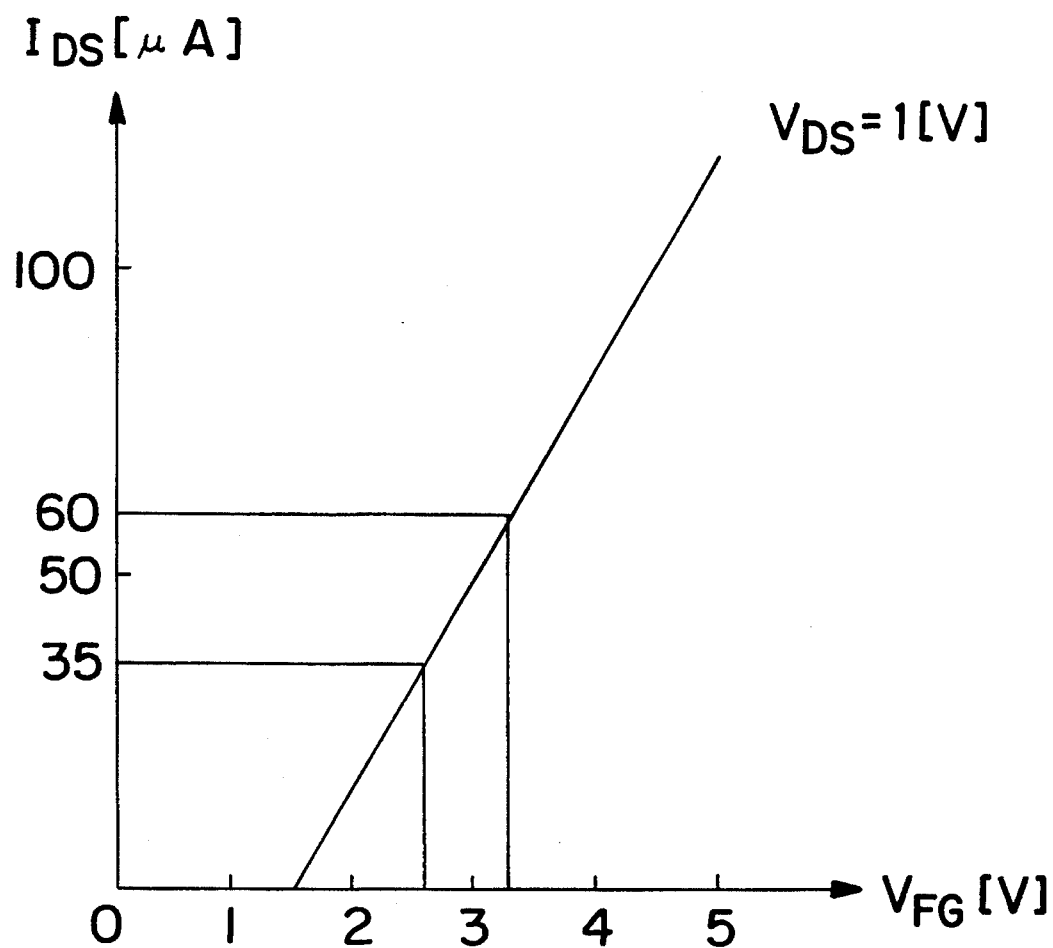
FIG. 4 shows the $I_{DS}$-$V_{FG}$ characteristic of the EPROM cell.

That is, the capacitive coupling ratio $C_{CF}/(C_{CF}+C_{FS})$ of EPROM cells $41_0$ through $41_n$ at 0.52 is smaller than the capacitive coupling ratio of EPROM cells $26_0$ through $26_n$ of the prior art shown in FIG. 1 (which is the same as the capacitive coupling ration of EPROM cells $15_{00}$ through $15_{nm}$ in the memory circuit part 1) at 0.64 (Refer to equation (6)). Therefore, if $$V_{CG}=5\, V$$

then, $$V_{FG}=2.6\, V$$

and the drain current IDS of EPROM cells $41_0$ through $41_n$ becomes 35 µA, which is approximately a half the drain current of EPROM cells $15_{00}$ through $15_{nm}$ (refer to FIG. 4). The capacitive coupling ratio of 0.52 of EPROM cells $41_0$ through $41_n$ in this case is only an example. It generally depends on the component characteristics. However, given the capacitive coupling ratio of EPROM cells $26_0$ through $26_n$ of the prior art being at 0.6, the capacitive coupling ratio of EPROM cells $41_0$ through $41_n$ of the second embodiment of this invention is desired to be, e.g., in the range of 0.3 through 0.5.

Thus, also in the second embodiment, the number of nMOS's for a load of the reference circuit part 4 is the same as the number of nMOS's for a load of the memory circuit part 1(i.e., one) and their load resistance value is also the same. Also, the drain current of EPROM cells $41_0$ through $41_n$ are configured to approximate a half of the drain current of EPROM cells $15_{00}$ through $15_{nm}$. Therefore, as in the first embodiment, each of the stray capacitances measured from the differential amplifier 3 of the memory circuit part 1 or the reference circuit part 4 become almost equal. Thus, the action speed is improved from that of the prior art, because the noise effect on the differential amplifier 3 is greatly reduced.

Third Embodiment of This Invention

Figure 9:
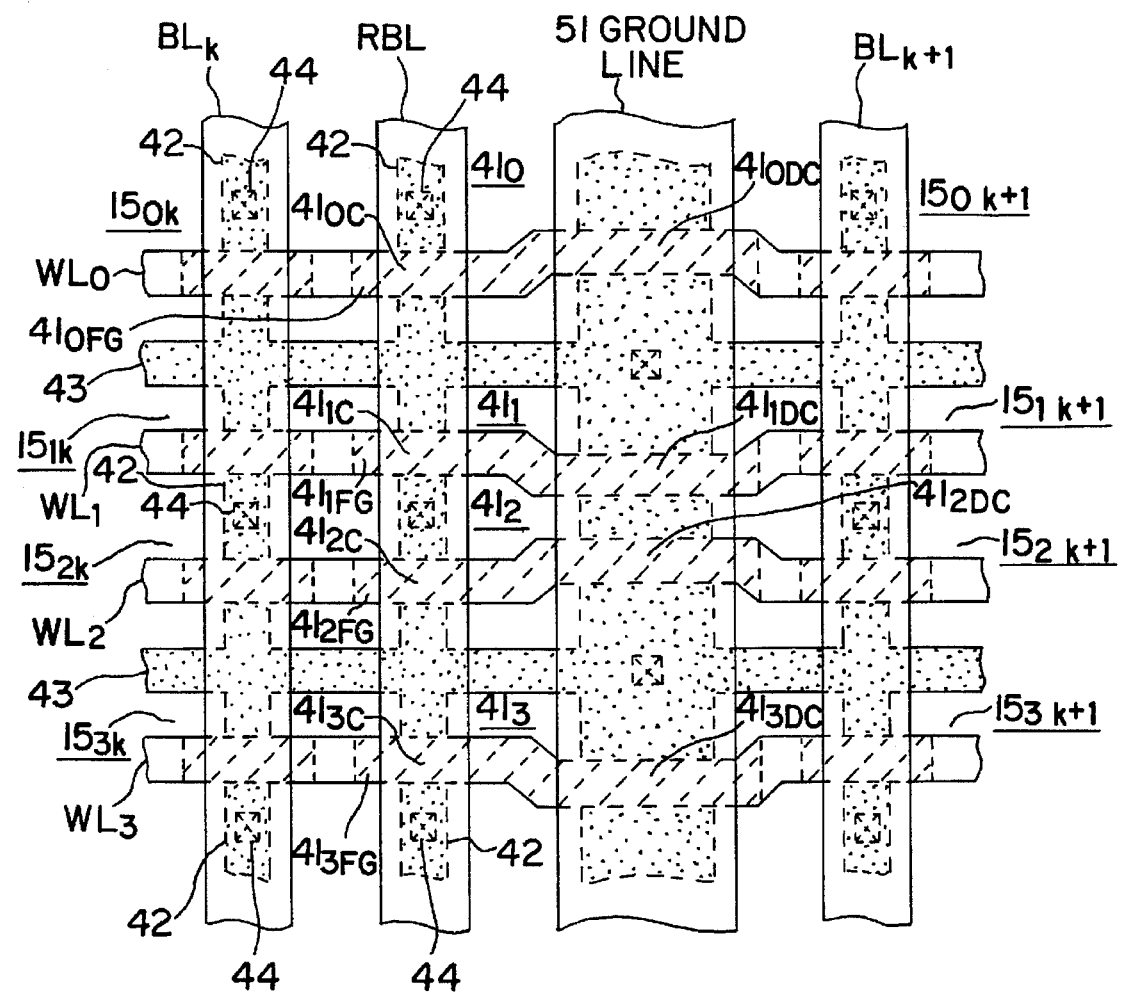
FIG. 9 is a plan view of part of the memory circuit part and the reference circuit part of the third embodiment of this invention.

FIG. 9 is a detailed plan view of a part of the third embodiment of this invention. In this embodiment, a reference bit line RBL and a ground line 51 are drawn between the (k+1)th bit line $BL_k$ and the (k+2)th bit line $BL_{k+1}$ among (m+1) pieces of the bit lines $BL_0$ through $BL_m$ (where k<m), and the dummy channel regions $41_{0DC}$ through $41_{nDC}$ of EPROM cells $41_0$ through $41_n$ along a reference bit line RBL are set under the ground line 51 for the contact with the source region 43 by avoiding the contact hole part of the ground line 51.

A similar action and effect to the earlier described second invention is also obtained, since dummy channel regions $41_{0DC}$ through $41_{nDC}$ of EPROM cells $41_0$ through $41_m$ are set under the ground line 51. Thus, the third embodiment of this invention has the advantage that the entire memory cell array is smaller than that of the second embodiment.

Incidentally, although the application of this invention to an EPROM is explained in these preferred embodiments, this invention is applicable to various nonvolatile semiconductor memory devices, such as EEPROM's and mask ROM's. However, for those devices in which the capacitive coupling ratio of the reference cell transistor is made smaller, as in the second and third embodiments, this invention is applicable where a memory cell transistor and a reference cell transistor comprise an EPROM cell having a floating gate.

Also, although a transistor is used for a load resistance in the above embodiments, basically an ordinary resistance can be used.

As explained, this invention enables load resistances of an equal number, of an equal size and having the same characteristics to be built in the reference circuit part and the memory circuit part. The stray capacitances of the memory circuit part and the reference circuit part are made almost the same. Thus, the level difference of the noise inputted to the input terminals of the differential amplifier becomes small. Therefore, this invention reduces the noise effect on the differential amplifier and enables faster data reading.

What is claimed is:

1. A nonvolatile semiconductor memory device a memory circuit part, a reference circuit part and a differential amplifier, said memory circuit part including:

a plurality of memory cell transistors arranged in a matrix, each having one of a first threshold voltage for a first memory state and a second threshold voltage for a second memory state, and each having a total size;

a plurality of bit lines to which sources or drains of each of said plurality of memory cell transistors are commonly connected along a first direction of said matrix;

a plurality of word lines to which gates of each of said plurality of memory cell transistors are commonly connected along a second direction of said matrix;

a plurality of selection transistors each connected to a terminal of each of said plurality of bit lines, respectively, for selecting one bit line of said plurality of bit lines;

a biasing transistor connected to said selected one bit line via a corresponding one of said plurality of selection transistors, for biasing said selected one bit line; and a load transistor, connected to said biasing transistor and having a connecting point connected to an input terminal of said differential amplifier, said reference circuit part including:

a plurality of reference cell transistors each having gates connected to each of said plurality of word lines and arranged respectively corresponding to each of said plurality of word lines, each of said plurality of reference cell transistors having a total size the same as the total size of each of said plurality of memory cell transistors and each having a total threshold voltage between said first threshold voltage and said second threshold voltage of each of said plurality of memory cell transistors to cause a drain current of said reference cell transistor to be approximately a median between a drain current of said memory cell transistor having said first threshold voltage and a drain current of said memory cell transistor having said second threshold voltage;

a reference bit line to which sources or drains of said plurality of reference cell transistors are commonly connected;

a plurality of selection transistors each for selecting said reference bit line, one of said selection transistors being connected to one terminal of said reference bit line;

a biasing transistor connected to said reference bit line via said one selection transistor, for biasing said reference bit line; and a load transistor, connected to said biasing transistor and having a connecting point connected to another input terminal of said differential amplifier, said differential amplifier, having said one input terminal connected to said connecting point between said biasing transistor of said memory circuit part and said load transistor of said memory circuit part and having said another input terminal connected to said connecting point between said biasing transistor of said reference circuit part and said load transistor of said reference circuit part, to compare outputs of one of said plurality of memory cell transistors and one of said plurality of reference cell transistors and to detect whether said one memory cell transistor represents said first memory state or said second memory state, a total number of said plurality of memory cell transistors in one of said bit lines being the same as a total number of said plurality of reference cell transistors;

said plurality of selection transistors of said memory circuit part and said plurality of selection transistors of said reference circuit part being of the same size, having the same characteristics and being of the same number;

said biasing transistor of said memory circuit part and said biasing transistor of said reference circuit part being of the same size, having the same characteristics and being of the same number; and said load transistor of said memory circuit part and said load transistor of said reference circuit part being of the same size, having the same characteristics and being of the same number, to equalize each stray capacitance of said memory circuit part and said reference circuit part as viewed from said differential amplifier and to eliminate a difference between noise levels input to two input terminals of the differential amplifier.

2. The nonvolatile semiconductor memory device according to claim 1, wherein said total threshold voltage of said reference cell transistor is controlled by injecting impurity ions into a channel region of said reference cell transistor.

3. The nonvolatile semiconductor memory device according to claim 1, wherein said total threshold voltage of said reference cell transistor is controlled by thickening a gate oxide film of said reference cell transistor.

4. The nonvolatile semiconductor memory device according to claim 1, wherein each of said memory cell transistors is an EPROM cell having a first control gate, a first floating gate, and one of said first memory state and said second memory state, and each of said reference cell transistors is an EPROM cell having a second control gate, a second floating gate, an authentic channel region used as a real transistor channel and a dummy channel region used as a capacitor, said dummy channel region having a same composition as said authentic channel region, said second control gate and said second floating gate being formed from an upside of said authentic channel region to an upside of said dummy channel region, said reference cell transistor having a capacitive ratio $(2A+W+B+X)/(2A+2W+B+2X)$ smaller than said memory cell transistor to cause a drain current of said reference cell transistor to be approximately a median between a drain current of said memory cell transistor having said first memory state and a drain current of said memory cell transistor having said second memory state, with A being an overhang length of said second floating gate from said authentic and dummy channel regions, B being a distance between said authentic channel region and said dummy channel region, W being a width of said authentic channel region and X being a width of said dummy channel region.

* * * * *

UNITED STATES PATENT AND TRADEMARK OFFICE
CERTIFICATE OF CORRECTION

PATENT NO. : 5,642,308
DATED : June 24, 1997
INVENTOR(S) : Masanobu YOSHIDA

It is certified that error appears in the above-indentified patent and that said Letters Patent is hereby corrected as shown below:

<u>TITLE PAGE [30] FOREIGN APPLICATION PRIORITY DATA</u>
"Oct. 20, 1989    [JP]    Japan..............2-273967"
should be --Oct. 20, 1989    [JP]    Japan............1-273967--.

Signed and Sealed this

Fourteenth Day of October, 1997

Attest:

BRUCE LEHMAN

*Attesting Officer*        *Commissioner of Patents and Trademarks*